United States Patent
Liu

(10) Patent No.: US 9,653,560 B1
(45) Date of Patent: May 16, 2017

(54) METHOD OF FABRICATING POWER MOSFET

(71) Applicant: Excelliance MOS Corporation, Hsinchu County (TW)

(72) Inventor: Chu-Kuang Liu, Hsinchu County (TW)

(73) Assignee: Excellence MOS Corporation, Hsinchu County (TW)

( * ) Notice: Subject to any disclaimer, the term of this patent is extended or adjusted under 35 U.S.C. 154(b) by 0 days.

(21) Appl. No.: 15/210,881

(22) Filed: Jul. 14, 2016

(30) Foreign Application Priority Data

May 18, 2016 (TW) .............................. 105115311 A

(51) Int. Cl.
| | |
|---|---|
| *H01L 29/423* | (2006.01) |
| *H01L 21/02* | (2006.01) |
| *H01L 21/311* | (2006.01) |
| *H01L 21/265* | (2006.01) |
| *H01L 29/66* | (2006.01) |

(52) U.S. Cl.
CPC ...... *H01L 29/4236* (2013.01); *H01L 21/0217* (2013.01); *H01L 21/02208* (2013.01); *H01L 21/02233* (2013.01); *H01L 21/02271* (2013.01); *H01L 21/265* (2013.01); *H01L 21/31144* (2013.01); *H01L 29/66484* (2013.01); *H01L 29/66666* (2013.01); *H01L 29/66734* (2013.01); *H01L 21/02255* (2013.01)

(58) Field of Classification Search
None
See application file for complete search history.

(56) References Cited

U.S. PATENT DOCUMENTS

| | | | |
|---|---|---|---|
| 7,385,248 B2 | 6/2008 | Herrick et al. | |
| 7,598,144 B2 | 10/2009 | Herrick et al. | |
| 8,143,123 B2 | 3/2012 | Grebs et al. | |
| 8,143,124 B2 | 3/2012 | Challa et al. | |
| 8,497,549 B2 | 7/2013 | Madson | |
| 8,610,205 B2 | 12/2013 | Probst | |
| 2003/0218208 A1* | 11/2003 | Lin ...................... | H01L 27/115 257/316 |
| 2007/0037327 A1 | 2/2007 | Herrick et al. | |
| 2008/0090339 A1* | 4/2008 | Herrick ................. | H01L 29/407 438/151 |
| 2009/0111231 A1* | 4/2009 | Grebs ................... | H01L 29/407 438/270 |
| 2010/0187602 A1* | 7/2010 | Woolsey ........... | H01L 21/28229 257/330 |
| 2011/0089485 A1 | 4/2011 | Gao et al. | |
| 2012/0104490 A1* | 5/2012 | Yilmaz ............... | H01L 29/7827 257/330 |

(Continued)

*Primary Examiner* — Asok K Sarkar
(74) *Attorney, Agent, or Firm* — Jianq Chyun IP Office

(57) ABSTRACT

A method of fabricating a power metal oxide semiconductor field effect transistor (MOSFET) is provided, and the method includes forming a semiconductor layer on a substrate, forming at least one first trench in the semiconductor layer, forming a thermal oxide layer on a surface of the trench, forming a first gate in the first trench, forming a chemical vapor deposition (CVD) oxide layer on the first gate in the first trench, forming a mask layer on the CVD oxide layer in the first trench so as to form a second trench between the mask layer and the thermal oxide layer, and forming a second gate in the second trench.

19 Claims, 23 Drawing Sheets

(56) References Cited

U.S. PATENT DOCUMENTS

| | | | |
|---|---|---|---|
| 2012/0280293 A1* | 11/2012 | Pan | H01L 29/0856 257/288 |
| 2015/0091084 A1* | 4/2015 | Lee | H01L 29/7806 257/334 |
| 2015/0108568 A1* | 4/2015 | Terrill | H01L 29/7813 257/331 |
| 2016/0359018 A1* | 12/2016 | Gao | H01L 29/407 |

* cited by examiner

METHOD OF FABRICATING POWER MOSFET

CROSS-REFERENCE TO RELATED APPLICATION

This application claims the priority benefits of Taiwan application serial no. 105115311, filed on May 18, 2016. The entirety of the above-mentioned patent application is hereby incorporated by reference herein and made a part of this specification.

BACKGROUND OF THE INVENTION

Field of the Invention

The invention relates to a method of fabricating a MOSFET (Metal-Oxide-Semiconductor Field-Effect Transistor), and more particularly, to a method of fabricating a power MOSFET.

Description of Related Art

A split-gate power MOSFET can also be referred to as a shielded-gate power MOSFET, and the structure thereof includes two separated gates isolated by an inter-poly-dielectric (IPD) inside a trench MOSFET, and thus the two separated gates has two different potentials. The gate located above is configured to form a channel in the MOSFET, and the gate located below is electrically coupled to a source potential via a metal interconnect for generating two-dimensional charge balance under a blocking operation. In addition, the IPD may contribute to the reduction of excessive gate-drain capacitance (Cgd) in a traditional trench MOSFET, so as to reduce switching loss.

However, since the thermal oxidation method used in the manufacture of the split-gate power MOSFET causes diffusion of dopant ions, the two separated gates cannot be effectively isolated. As a result, a higher potential cannot be tolerated when the split-gate power MOSFET is used in high-voltage applications.

SUMMARY OF THE INVENTION

The invention is directed to a method of fabricating a power MOSFET. The method can be applied to fabricate the power MOSFET with constant efficiency when a high voltage field is applied, and the manufacturing reliability of the power MOSFET can be increased.

In an embodiment of the invention, a method of fabricating a power MOSFET includes forming a semiconductor layer on a substrate and forming at least one first trench in the semiconductor layer. A first thermal oxide layer is formed on a surface of the first trench, a first gate is formed in the first trench, and a first chemical vapor deposition (CVD) oxide layer is formed on the first gate in the first trench. A mask layer is formed on the first CVD oxide layer in the first trench, and a second trench exists between the mask layer and the first thermal oxide layer. A second gate is formed in the second trench.

According to an embodiment of the invention, after the first gate is formed in the first trench, a portion of the first thermal oxide layer on a sidewall of the first trench is removed, so as to thin out the first thermal oxide layer.

According to an embodiment of the invention, before the first CVD oxide layer is formed on the first gate in the first trench, a second thermal oxide layer is formed on the first gate.

According to an embodiment of the invention, the step of forming the second thermal oxide layer includes performing an implantation process on the first gate, removing a portion of the first thermal oxide layer to expose corners of the first gate and thin out the first thermal oxide layer, and performing a thermal oxidation process to form the second thermal oxide layer and round the corners of the first gate.

According to an embodiment of the invention, a method of forming the first CVD oxide layer on the first gate in the first trench includes forming the first CVD oxide layer on the first gate and in the first trench through performing a CVD process, forming the mask layer in the first trench, so as to expose a portion of the first CVD oxide layer, and removing the exposed portion of the first CVD oxide layer by using the mask layer as an etching mask, so as to form the second trench.

According to an embodiment of the invention, before the first CVD oxide layer us formed, a silicon nitride layer is formed on the first thermal oxide layer; after the exposed portion of the first CVD oxide layer is removed, an exposed portion of the silicon nitride layer is removed.

According to an embodiment of the invention, the second gate covers the mask layer.

According to an embodiment of the invention, the mask layer includes a conductive material or a non-conductive material, for instance.

According to an embodiment of the invention, a method of forming the first CVD oxide layer includes performing a high temperature CVD process or a CVD process with use of tetraethyl orthosilicate (TEOS) as a raw material.

According to another embodiment of the invention, after the first thermal oxide layer is formed on the surface of the first trench, a silicon nitride layer and a second CVD oxide layer are sequentially formed on the first thermal oxide layer.

According to another embodiment of the invention, after the first gate is formed in the first trench, a portion of the second CVD oxide layer on a sidewall of the first trench is removed, so as to thin out the second CVD layer.

According to another embodiment of the invention, before the first CVD oxide layer is formed on the first gate in the first trench, a second thermal oxide layer is formed on the first gate.

According to another embodiment of the invention, the step of forming the second thermal oxide layer includes performing an implantation process on the first thermal oxide layer and removing a portion of the second CVD oxide layer to expose corners of the first gate and thin out the second CVD oxide layer. A thermal oxidation process is performed to form the second thermal oxide layer and round the corners of the first gate.

According to another embodiment of the invention, before the first CVD oxide layer is formed on the first gate and after the second thermal oxide layer is formed on the first gate, a third thermal oxide layer is formed on the second thermal oxide layer.

According to another embodiment of the invention, a method of forming the first CVD oxide layer on the first gate in the first trench includes forming the first CVD oxide layer on the semiconductor layer and in the first trench through performing the CVD process and forming the mask layer in the first trench, so as to expose a portion of the first CVD oxide layer. The exposed portion of the first CVD oxide layer is removed by using the mask layer as an etching mask, so as to expose a portion of the silicon nitride layer. The exposed portion of the silicon nitride layer is removed to form the second trench.

According to another embodiment of the invention, the second gate covers the mask layer.

According to another embodiment of the invention, the mask layer includes a conductive material or a non-conductive material, for instance.

According to another embodiment of the invention, a method of forming the second CVD oxide layer includes performing a high temperature CVD process or a CVD process with use of tetraethyl (TEOS) as a raw material.

In view of the above, the first gate and the second gate are separated from each other by the CVD oxide layer formed in the trench, and thus the power MOSFET provided herein can effectively prevent current leakage when the high operating voltage is applied. In addition, the thickness of the oxide layer between the first gate and the second gate may be increased according to the existence of the first CVD oxide layer, and thus the voltage across the oxide layer of the power MOSFET may rise. Besides, the mask layer formed in the fabricating process provided herein can be considered as part of the second gate, and thus the variability of the overall fabricating process can be enhanced.

Several exemplary embodiments accompanied with figures are described in detail below to further describe the disclosure in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

The figures in the following embodiments are intended to more comprehensively describe the exemplary embodiments of the inventive concept, but the invention can still be implemented in many different forms, and the invention should not be construed as limited to the recited embodiments. In the figures, for clarity, the relative thickness and location of film layers, regions, and/or structural devices may be reduced or enlarged. Moreover, in the present specification, "first" and "second" . . . etc. are used to describe different regions, film layers, and/or blocks, but such terms are only intended to differentiate a region, film layer, or block from another region, film layer, or block. Therefore, a first region, film layer, or block discussed below can be referred to as a second region, film layer, or block without compromising the teaching of the embodiment.

FIG. 1A through FIG. 1H are schematic cross-sectional views illustrating a process of fabricating a power MOSFET according to a first embodiment of the invention.

Figure 1A:
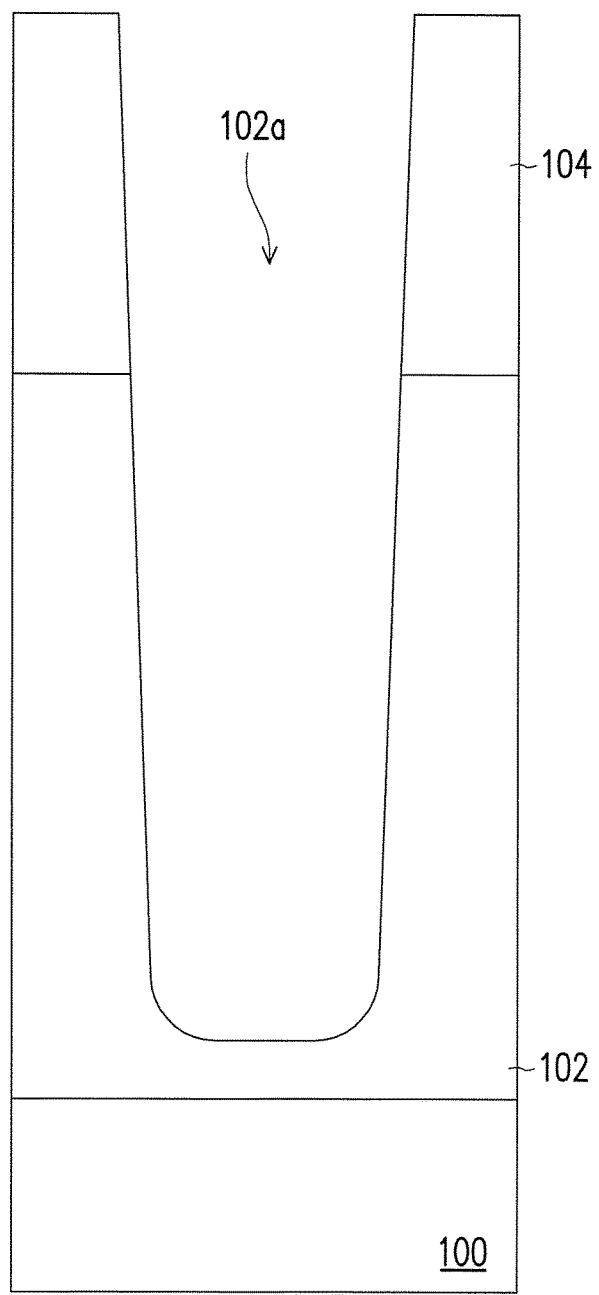
FIG. 1A through FIG. 1H are schematic cross-sectional views illustrating a process of fabricating a power MOSFET according to a first embodiment of the invention.

With reference to FIG. 1A, a semiconductor layer 102 is formed on a substrate 100. In the present embodiment, no specific restriction is imposed on the substrate 100. The semiconductor layer 102 is, for instance, a doped silicon layer or a doped epitaxial layer. At least one first trench 102a is formed in the semiconductor layer 102 through performing a photolithographic and etching process, for instance. A patterned mask layer (not shown) is formed on the semiconductor layer 102 to expose a portion of the semiconductor layer 102, for instance. The exposed portion of the semiconductor layer 102 is etched with use of the patterned mask layer as a mask, and the patterned mask layer is removed. Even through only one trench is shown in FIG. 1, it is well-known that there may be many trenched formed herein. Before the first trench 102a is formed in the semiconductor layer 102, a well region 104 may be formed in the semiconductor layer 102, which should however not be construed as a limitation to the invention. That is, the well region 104 may also be formed in subsequent manufacturing steps.

Figure 1B:
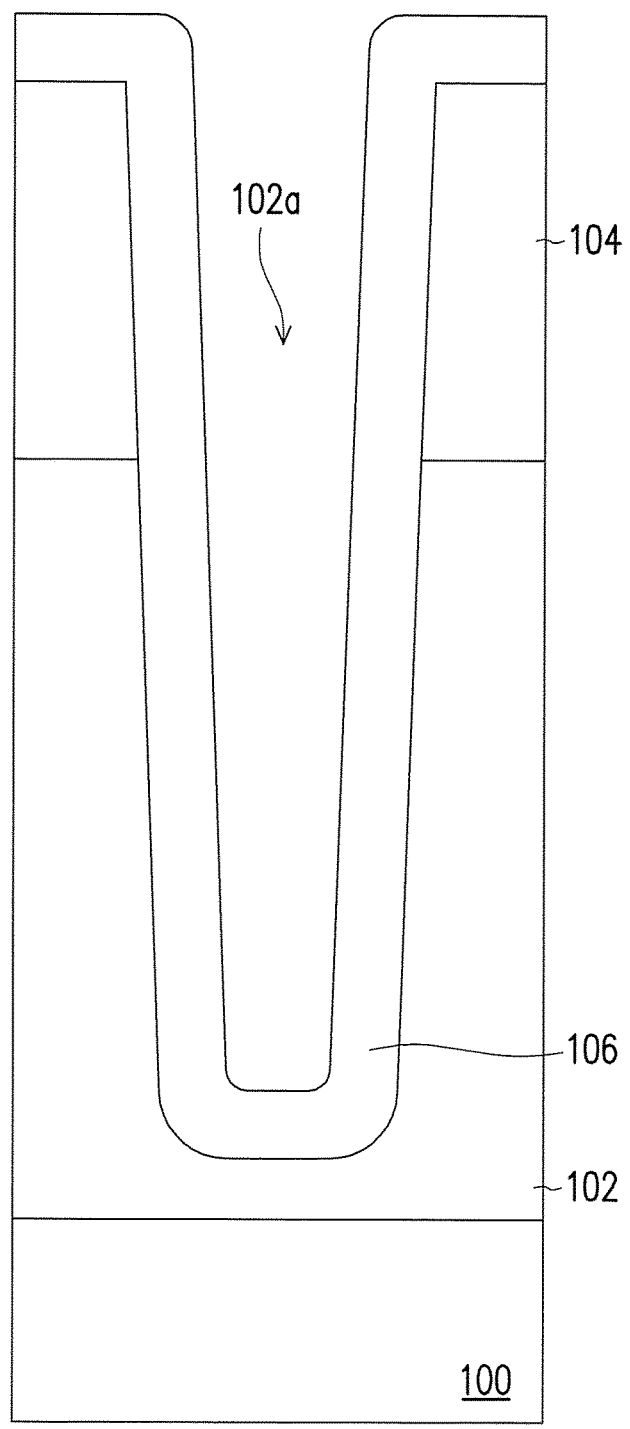

With reference to FIG. 1B, the first thermal oxide layer 106 is formed on a surface of the first trench 102a. A method for forming the first thermal oxide layer 106 is, for instance, a thermal oxidation method. In the present embodiment, the manufacture of the first thermal oxide layer 106 through applying the thermal oxidation method requires high process temperature (e.g., 900° C.-1200° C.), for instance, and therefore the resultant first thermal oxide layer 106 is made of a material (e.g., silicon dioxide) with high density and can provide surface protection in subsequent manufacturing steps.

Figure 1C:
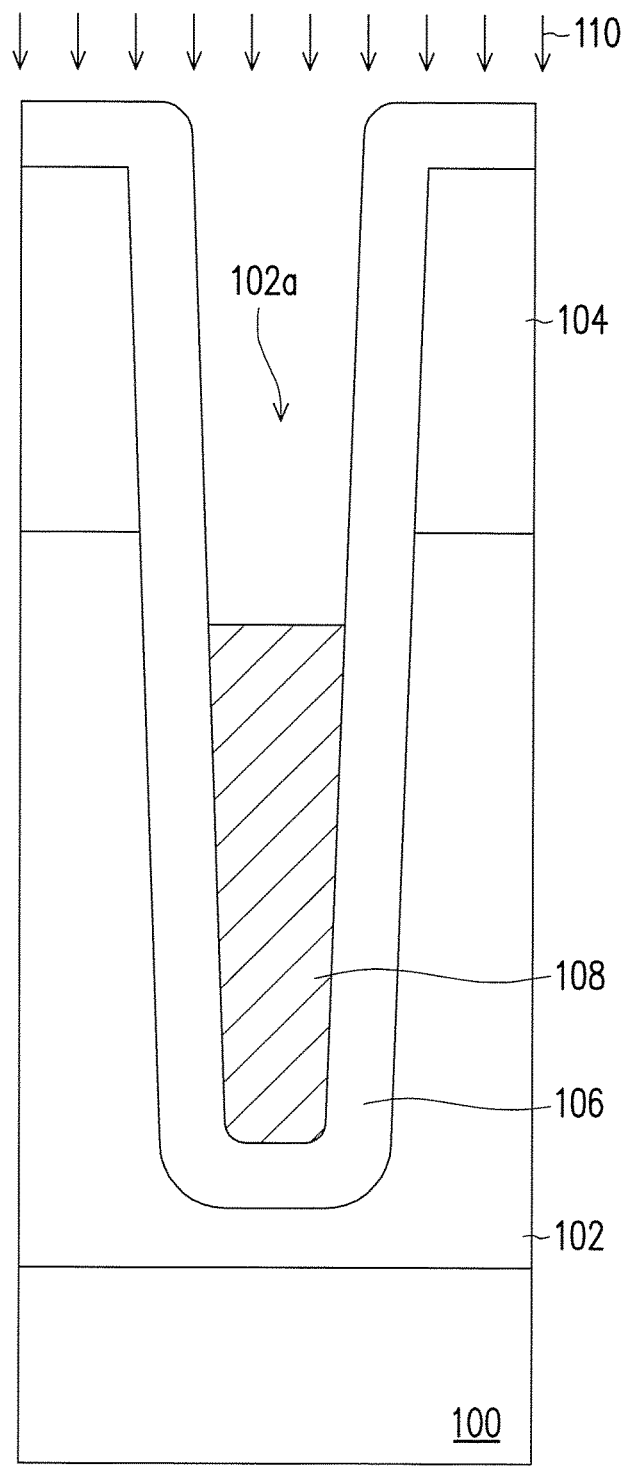

With reference to FIG. 1C, a first gate 108 is formed in the first trench 102a. In the present embodiment, the first gate 108 is formed by performing a chemical vapor deposition (CVD) process, a physical vapor deposition (PVD) process, or other suitable film-forming processes to form a conductive layer on the semiconductor layer 102 and in the first trench 102a, and a chemical mechanical polishing (CMP) process and an anisotropic etching process are sequentially performed on the conductive layer, so as to form the first gate 108 in the first trench 102a. Since corners of the first gate 108 can be rounded subsequently, an implantation process 110 can be selectively performed on the first gate 108, so as to enhance the oxidation rate of the first gate 108 in the subsequent thermal oxidation process.

Figure 1D:
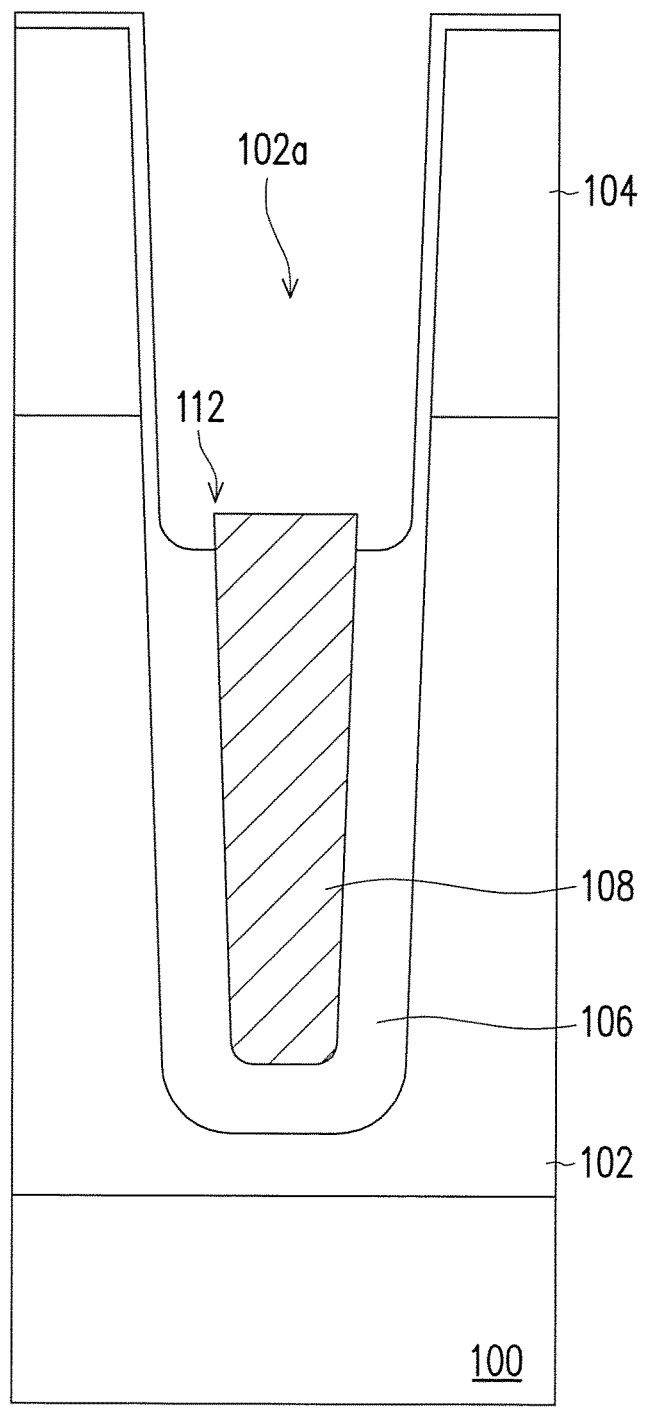

With reference to FIG. 1D, a portion of the first thermal oxide layer 106 is removed, so as to thin out the first thermal oxide layer 106. In other words, the thickness of first thermal oxide layer 106 may be reduced after removing step. In the present embodiment, a method of removing a portion of the first thermal oxide layer 106 is to perform a wet etching process for etching the portion of the first thermal oxide layer 106 on a sidewall of the first trench 102a. If the method of removing a portion of the first thermal oxide layer 106 is continuously performed, corners 112 of the first gate 108 can be exposed; in the subsequent thermal oxidation process, the corners of the first gate 108 can be rounded.

Figure 1E:
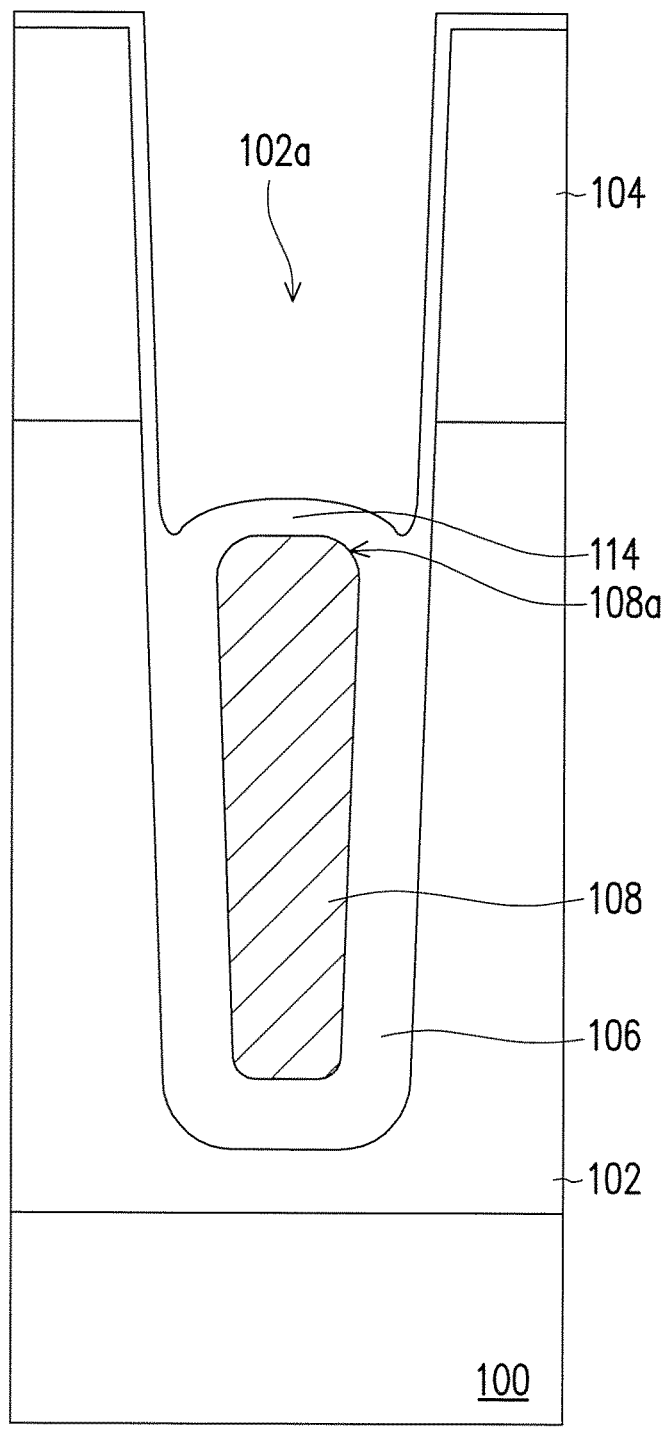

With reference to FIG. 1E, the thermal oxidation process is performed to form the second thermal oxide layer 114 and round the corners of the first gate 108. In the present embodiment, through performing the thermal oxidation process on the first gate 108, the surface of the first gate 108 with high dopant concentration can be oxidized rapidly, and rounded corners 108a can be formed. However, the invention is not limited thereto. If the corners of the first gate 108 are not fangs but round corners, the input capacitance (e.g., the gate-source capacitance $C_{gs}$) can be reduced, or the reverse leakage current (e.g., the gate leakage current $I_{gss}$) can be reduced; as such, the reliability of the power MOSFET can be improved.

Figure 1F:
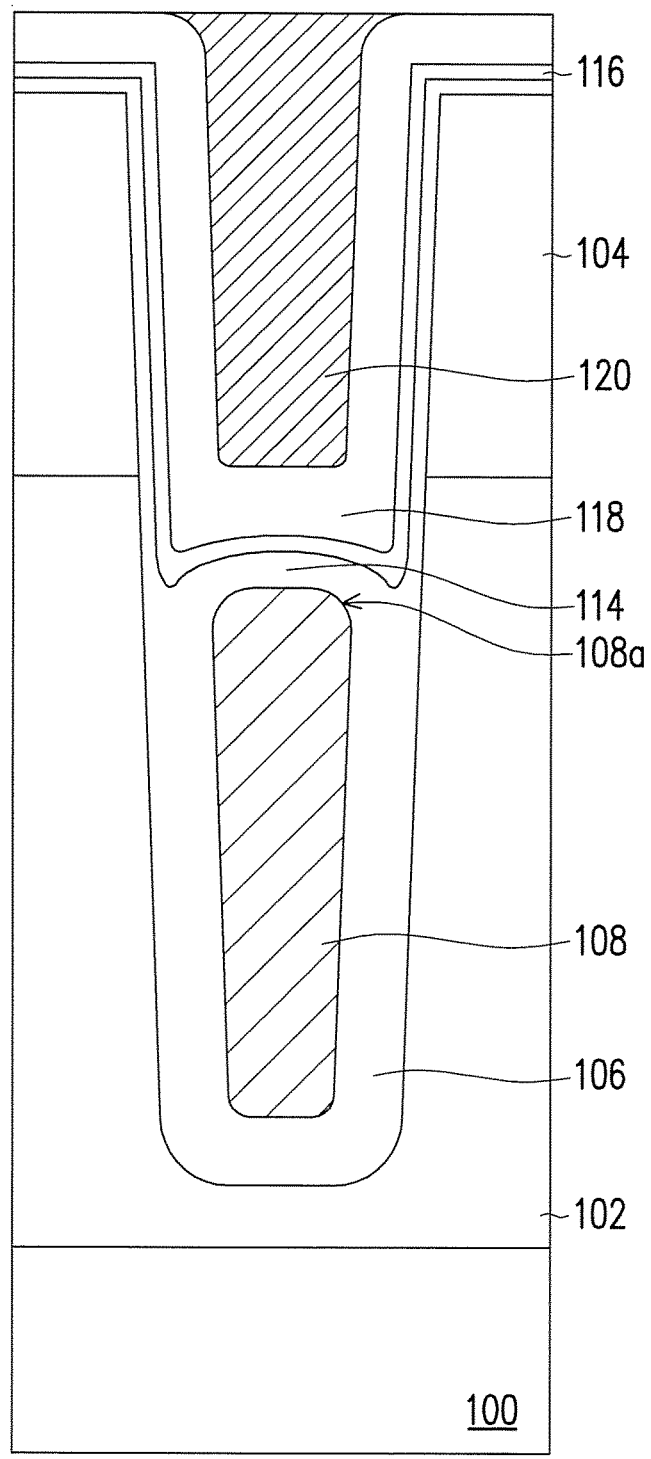

With reference to FIG. 1F, a silicon nitride layer 116 is formed on the substrate 100 to cover the first thermal oxide layer 106 in the first trench 102, and a first CVD oxide layer 118 is formed on the first gate 108 in the first trench 102a. In one embodiment, a method of forming the first CVD oxide layer 118 includes a high temperature CVD process. In another embodiment, the method of forming the first CVD oxide layer 118 includes a CVD process with use of TEOS as a raw material, wherein the CVD process may be a low pressure CVD process. Here, the first CVD oxide layer 118 formed on the first gate 108 in the first trench 102 contributes to the increase in the thickness of the oxide layer on the first gate 108, such that the voltage cross the oxide layer that can be borne by the power MOSFET provided herein is raised. Besides, in the present embodiment, before the first CVD oxide layer 118 is formed and after the silicon nitride layer 116 is formed, a thermal oxidation process may be selectively performed, so as to form a thermal oxide layer (not shown) between the first gate 108 and the first CVD oxide layer 118. As such, the thickness of the oxide layer on the first gate 108 can be further increased to the thickness meeting the device design. A mask layer 120 is formed in the first trench 102a, and the mask layer 120 is made of, for instance, a conductive material or a non-conductive material, for instance. According to the present embodiment, the mask layer 120 may be made of metal, polysilicon, amorphous silicon, and so on, and the mask layer may be formed by performing a CVD process, a PVD process, or any other suitable film-forming process, for example. In an embodiment of the invention, the first trench 102a may be filled with the mask layer 120, but the invention is not limited thereto.

Figure 1G:
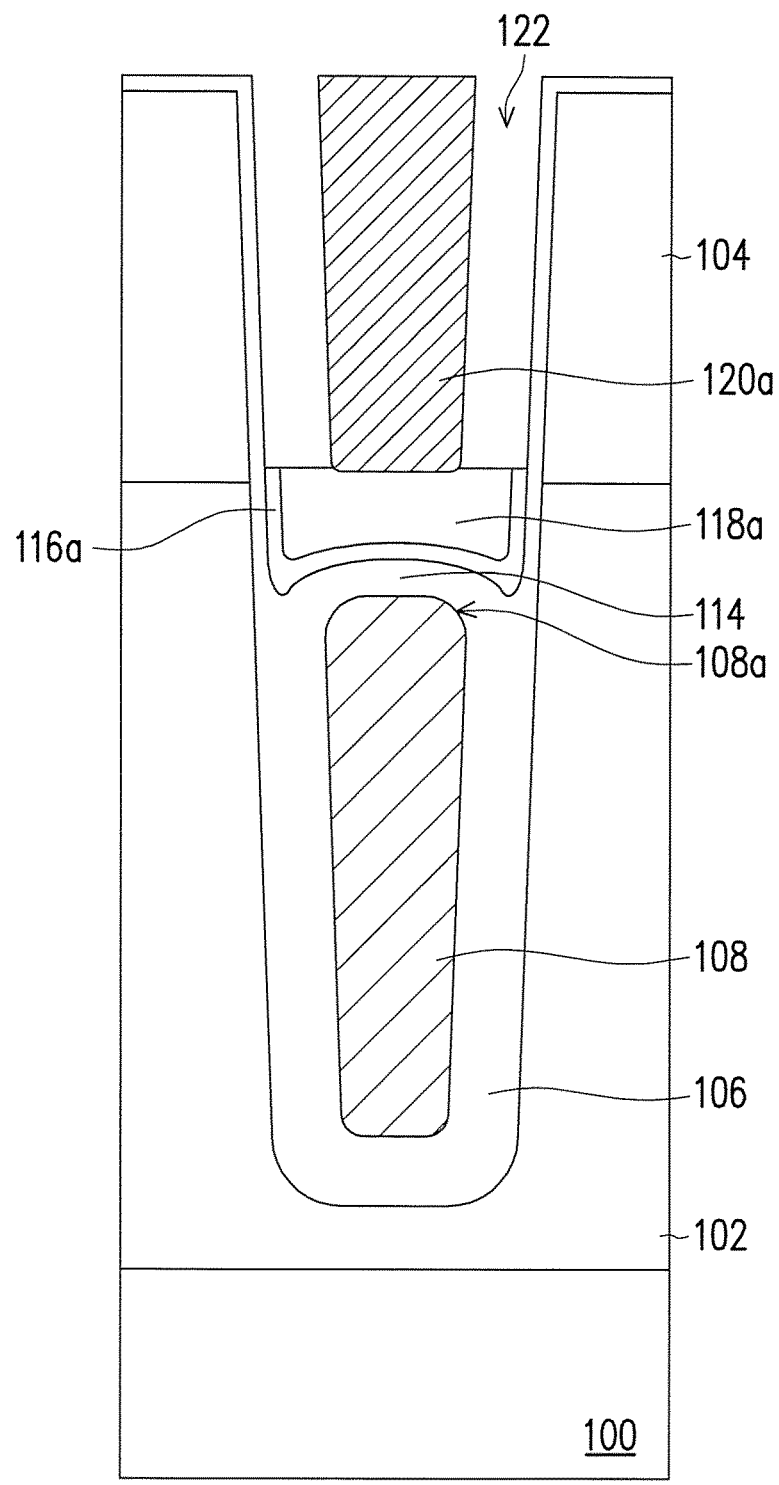

With reference to FIG. 1G, the mask layer 120 shown in FIG. 1F may be etched back (i.e., through performing an anisotropic etching process), and then the first CVD oxide layer (i.e., the layer 118 shown in FIG. 1F) exposed by the sidewall of the first trench 102a is removed by using the mask layer 120a as the etching mask, so as to expose the silicon nitride layer shown in FIG. 1F. At this time, the silicon nitride layer 116 can protect the first thermal oxide layer 106 from being affected by the etching process performed on the first CVD oxide layer. The silicon nitride layer 116 exposed by the sidewall of the first trench 102a is then removed to form a second trench 122. Here, the structure between the first gate 108 and the mask layer 120 contains the second thermal oxide layer 114, the silicon nitride layer 116a, and the first CVD oxide layer 118a.

Figure 1H:
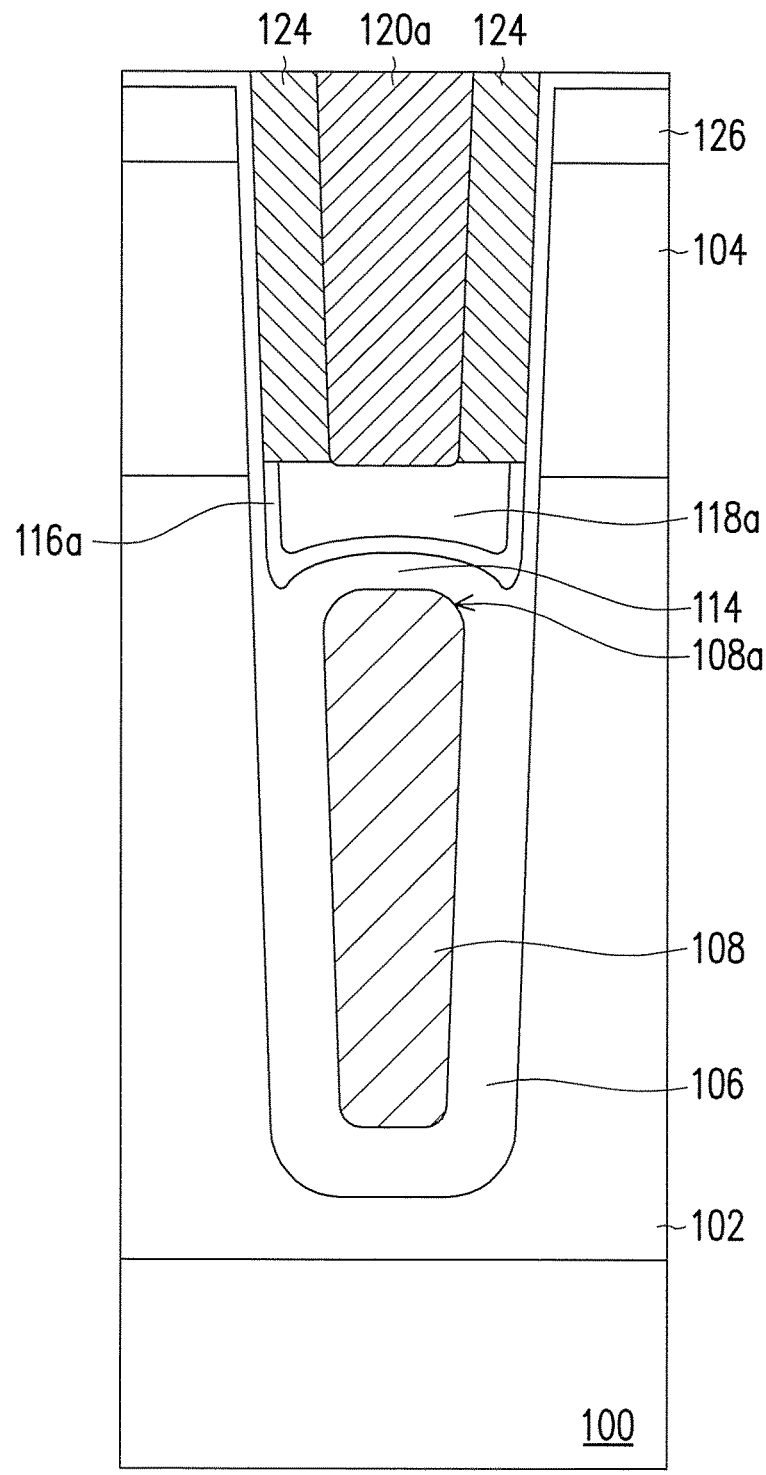

With reference to FIG. 1H, a second gate 124 is formed in the second trench 122. The second gate 124 is, for instance, formed by forming a conductive layer on the semiconductor layer 102 and in the first trench 102a through performing a CVD process, a PVD process, or any other suitable film-forming process and performing a CMP process on the conductive layer. Here, the conductive layer fills the second trench 122. A source region 126 can then be formed in the well region 104 through performing an implantation process or the like. In the present embodiment, since the mask layer 120a is made of a conductive material, the mask layer 120a can function as the second gate of the power MOSFET. Since the mask layer 120a and the second gate 124 are not simultaneously formed, the material of the mask layer 120a may be different from the material of the second gate 124. During the process of manufacturing the power MOSFET, the mask layer 120a acts as the protection layer of the first CVD oxide layer 118a in the etching process; hence, the mask layer 120a is preferably made of a material having the etching rate lower than that of oxide, so as to protect the first CVD oxide layer 118a formed between the first gate 108 and the second gate 124. The second gate 124 is located on the sidewall of the mask layer 120a and is in direct contact with the mask layer 120a; therefore, the second gate 124 can repair the defects on the side of the mask layer 120a acting as the protection layer in the etching process, and the second gate 124 can also fill the second trench 122 shown in FIG. 1G through gap filling process. In addition, the oxide quality of the first CVD oxide layer 118a is greater than that of the oxide layer formed by performing the thermal oxidation process; therefore, the first CVD oxide layer 118a formed between the first gate 108 and the second gate 124 can effectively isolate the first gate 108 from the second gate 124. As such, the power MOSFET provided in the present embodiment can tolerate high potential without triggering the issue of current leakage.

With reference to FIG. 1H again, the first thermal oxide layer 106 located between the second gate 124 and the well region 104 can act as the gate oxide layer. The drain region (not shown) is often located on a surface of the substrate 100 where no semiconductor layer 102 is formed. Besides, film layers (e.g., an insulation layer, not shown) may be disposed on the second gate 124 according to the actual design.

Figure 2A:
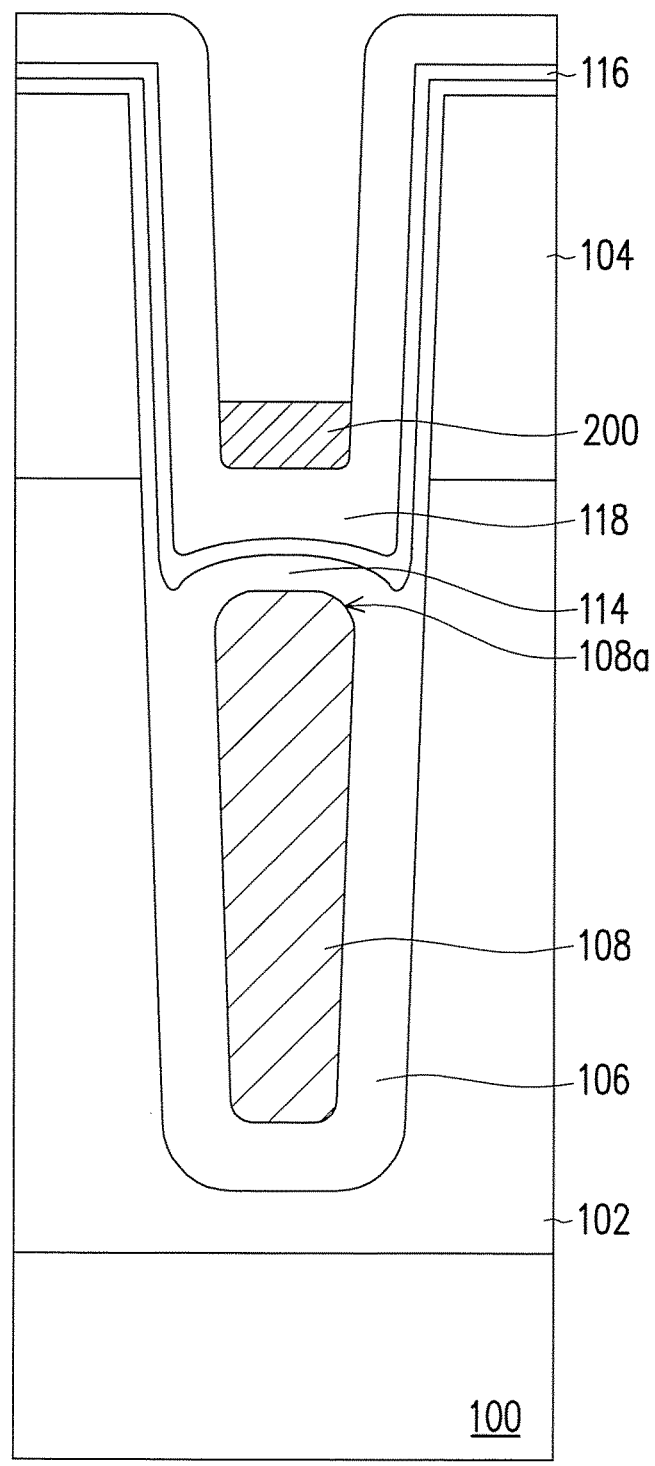
FIG. 2A through FIG. 2C are cross-sectional views depicting a variation example in the first embodiment.
Figure 2B:
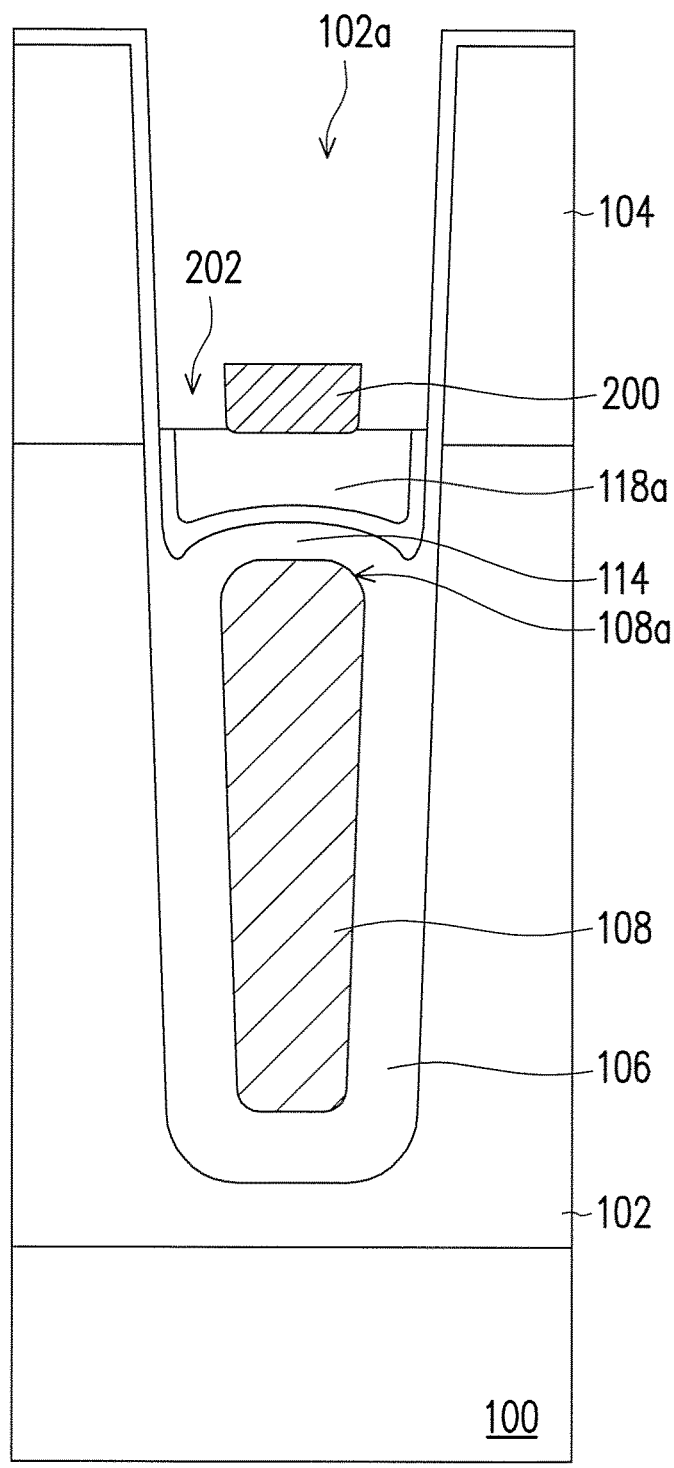
Figure 2C:
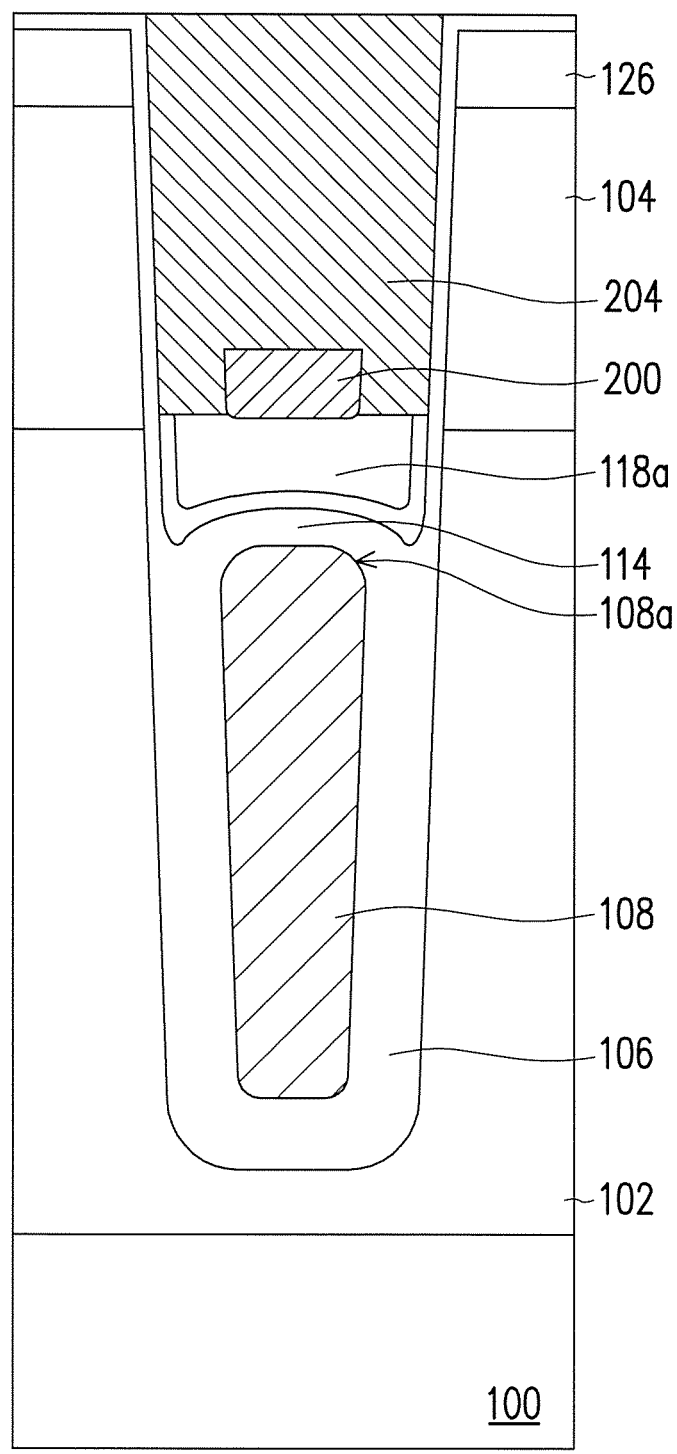

FIG. 2A through FIG. 2C are cross-sectional views depicting a variation example in the first embodiment, wherein the same or similar reference numerals are applied to represent the same components in the first embodiment, and no repetitive description will be provided hereinafter.

With reference to FIG. 2A, after the fabricating steps depicted in FIG. 1A to FIG. 1F are performed, the mask layer may be etched back (i.e., through performing an anisotropic etching process), so as to obtain the mask layer 200 shown in FIG. 2A. The mask layer 200 can be made of a conductive material (e.g., metal, polysilicon, or amorphous silicon that can be used as the gate) or a non-conductive material having the etching rate lower than that of oxide, e.g., silicon nitride.

With reference to FIG. 2B, the exposed first CVD oxide layer (e.g., the layer 118 shown in FIG. 2A) is then removed, so as to expose the silicon nitride layer 116 depicted in FIG. 2A. Here, the silicon nitride layer 116 acts as the protection layer of the first thermal oxide layer 106 in the etching process. The exposed silicon nitride layer 116 is then removed to form the second trench 202. At this time, the mask layer 200 serves as the protection layer of the first CVD oxide layer 118a in the etching process.

With reference to FIG. 2C, the first trench 102a is filled with the second gate 204. The second gate 204 is, for instance, formed by forming a conductive layer on the semiconductor layer 102 and in the first trench 102a through performing a CVD process, a PVD process, or any other suitable film-forming process and performing a CMP process or an anisotropic etching process on the conductive layer. In the present embodiment, the second gate 204 fills the first trench 102a and covers the mask layer 200. A source region 126 can then be formed in the well region 104. In the present embodiment, the mask layer 200 and the second gate 204 are not simultaneously formed, and therefore the material of the mask layer 200 may be different from the material of the second gate 204. Besides, the mask layer 200 is covered by the second gate 204, and therefore the mask layer 200 can be made of a conductive material (e.g., metal, polysilicon, or amorphous silicon that can be used as the gate) or a non-conductive material having the etching rate lower than that of oxide, e.g., silicon nitride. In the meanwhile, the second gate 204 covers the entire mask layer 200; hence, the second gate 204 is able to repair the damages caused in the etching process to the mask layer 200 and also fill the second trench 202 depicted in FIG. 2B through gap filling process. Even though the mask layer 200 is made of the non-conductive material, the power MOSFET can operate well because the second gate 204 is located in an active region.

FIG. 3A through FIG. 3H are schematic cross-sectional views illustrating a process of fabricating a power MOSFET according to a second embodiment of the invention.

Figure 3A:
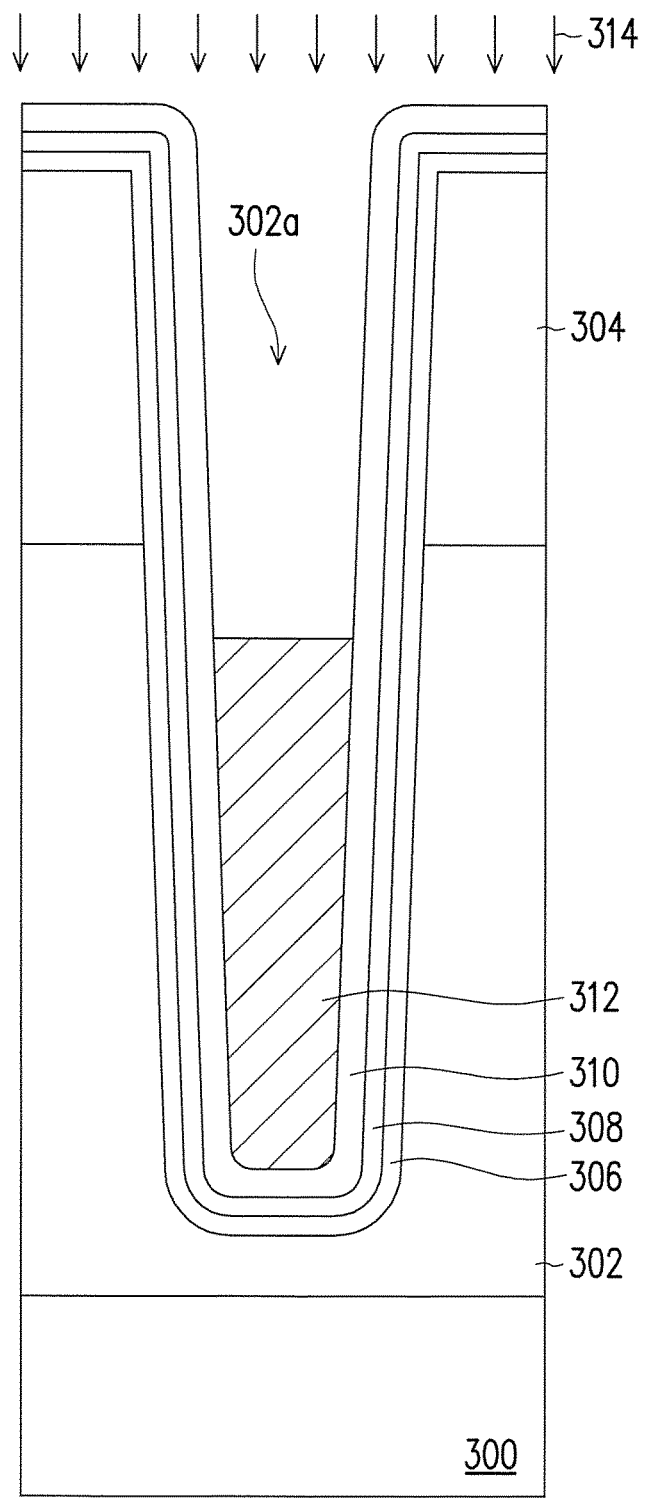
FIG. 3A through FIG. 3H are schematic cross-sectional views illustrating a process of fabricating a power MOSFET according to a second embodiment of the invention.

With reference to FIG. 3A, a semiconductor layer 302 is formed on a substrate 300, and a first trench 302a is formed in the semiconductor layer 302. Besides, before the first trench 302a is formed in the semiconductor layer 302, a well region 304 may be formed in the semiconductor layer 302, which should however not be construed as a limitation to the invention. That is, the well region 304 may also be formed in subsequent manufacturing steps. The detailed method of fabricating the semiconductor layer 302 and the well region 304 as well as the structure and the material of the semiconductor layer 302 and the well region 304 may be referred to as those provided in the first embodiment and thus will not be further explained. Thereafter, the first thermal oxide layer 306, the silicon nitride layer 308, and the CVD oxide layer 310 are sequentially formed on the surface of the first trench 302a, and the first gate 312 is then formed in the first trench 302a. The detailed method of fabricating the first thermal oxide layer 306 and the first gate 312 as well as the structure and the material of the first thermal oxide layer 306 and the first gate 312 may be referred to as those provided in the first embodiment and thus will not be further explained. The method of forming the silicon nitride layer 308 includes, for example but not limited to, CVD or any other suitable film-forming process. The silicon nitride layer 308 may serve to prevent the doping elements in the semiconductor layer 302 from further diffusing, thus effectively isolating the semiconductor layer 302 from the subsequently formed conductive layer. As a result, the reliability of the power MOSFET provided in the second embodiment can be improved. A method of forming the CVD oxide layer 310 is, for instance, to perform a high temperature CVD process or a low temperature CVD process with use of TEOS as a raw material. In the present embodiment, the CVD oxide layer 310 is located between the first gate 312 and the silicon nitride layer 308, so as to prevent the interfacial defects resulting from the direct contact between the first gate 312 and the silicon nitride layer 308. An implantation process 314 is selectively performed on the first gate 312, so as to enhance the oxidation rate of the first gate 312 in the thermal oxidation process.

Figure 3B:
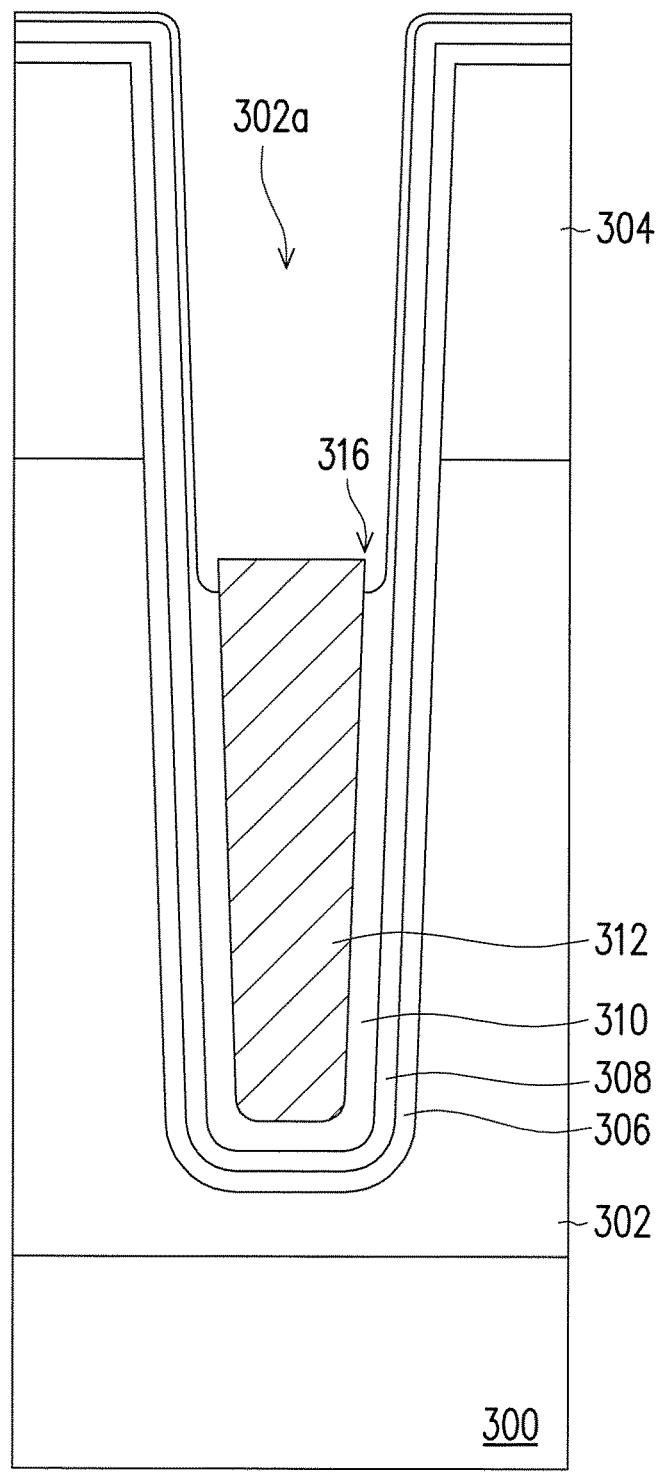

With reference to FIG. 3B, a portion of the CVD oxide layer 310 is removed, so as to expose corners 316 of the first gate 312 and thin out the CVD oxide layer 310. In the present embodiment, a method of removing the CVD oxide layer 310 is, for instance, wet etching. According to the present embodiment, the exposure of the corners 316 of the first gate 312 is conducive to the subsequent thermal oxidation process, and the corners of the first gate 312 can be rounded to improve the reliability of the power MOSFET.

Figure 3C:
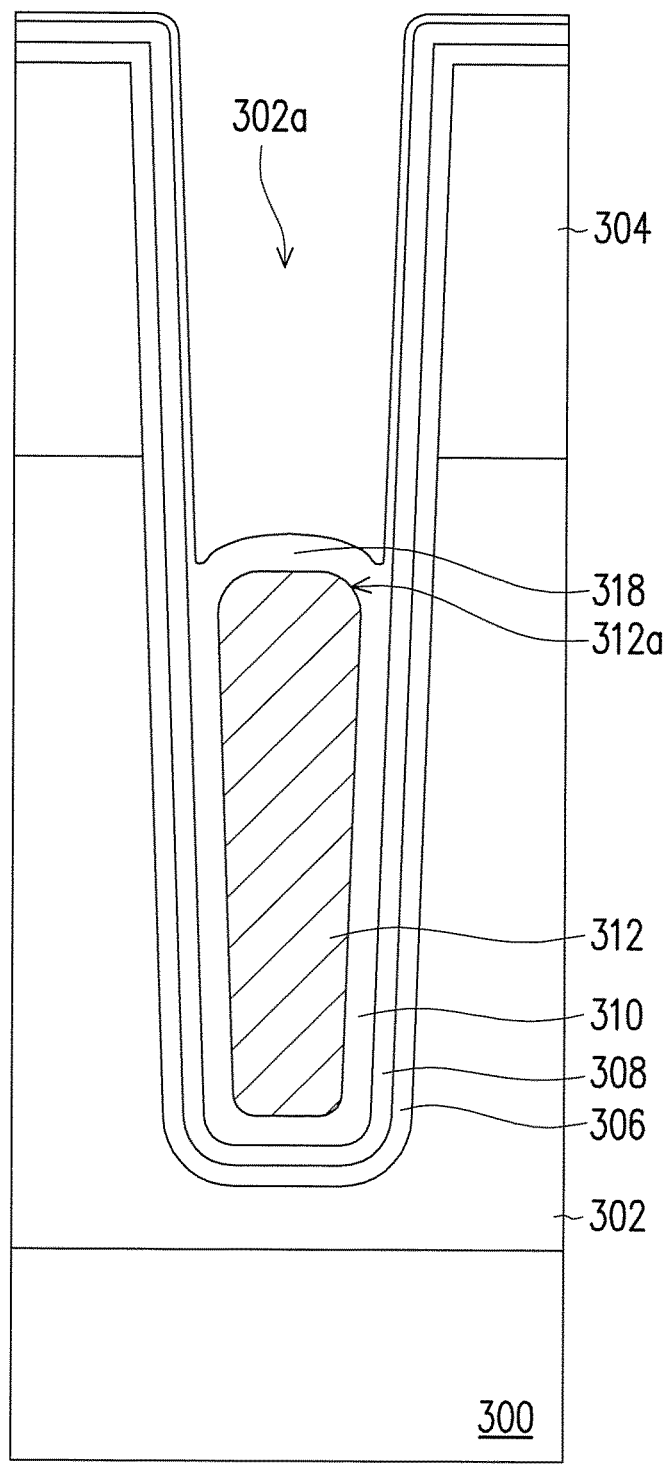

With reference to FIG. 3C, the thermal oxidation process is performed to form the second thermal oxide layer 318 and round the corners of the first gate 312. In the present embodiment, the thermal oxidation process performed on the first gate 312 allows the surface of the first gate 312 with high dopant concentration to be oxidized rapidly, so as to form round corners 312a. That is, the corners of the first gate 312 are not fangs, and therefore the input capacitance (e.g., the gate-source capacitance $C_{gs}$) can be reduced, or the reverse leakage current (e.g., the gate leakage current $I_{gss}$) can be reduced; as such, the reliability of the power MOSFET can be improved.

Figure 3D:
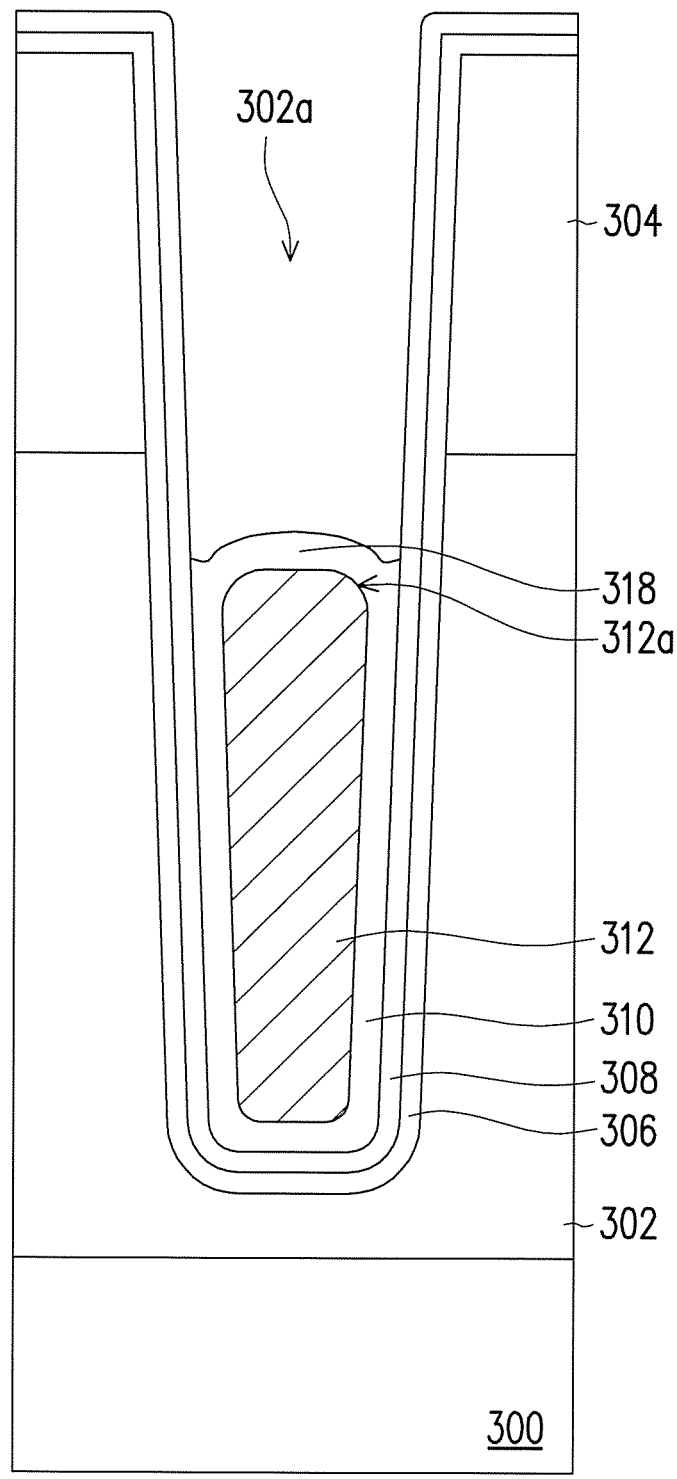

With reference to FIG. 3D, the residual CVD oxide layer 310 on the sidewall of the first trench 302a is removed, and the silicon nitride layer 308 on the sidewall of the first trench 302a is exposed. In the present embodiment, a method of removing the residual CVD oxide layer 310 is, for instance, wet etching. Other oxidation processes are performed subsequently; therefore, the residual CVD oxide layer 310 on the sidewall of the first trench 302a can be removed to prevent additional oxide from being formed. As such, the thickness of the oxide layer in the well region 304 is not overly thick.

Figure 3E:
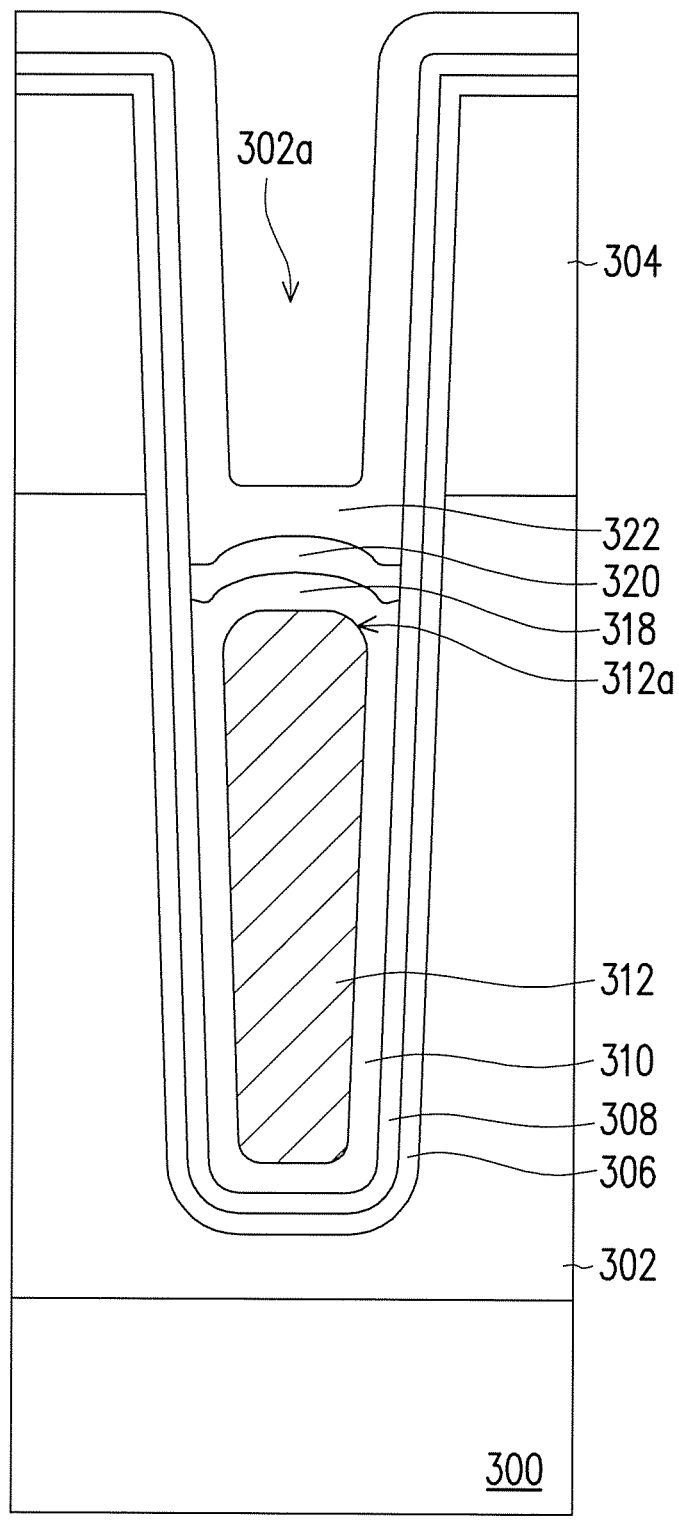

With reference to FIG. 3E, a third thermal oxide layer 320 is formed on the second thermal oxide layer 318, and another CVD oxide layer 322 is formed on the first gate 312 in the first trench 302a. A method for forming the third thermal oxide layer 320 is, for instance, a thermal oxidation method. The formation of the third thermal oxide layer 320 allows the oxide layer on the first gate 312 to be thick enough to meet the device design. The detailed method of fabricating the CVD oxide layer 322 as well as the structure and the material of the CVD oxide layer 322 may be referred to as those provided in the first embodiment and thus will not be further explained.

Figure 3F:
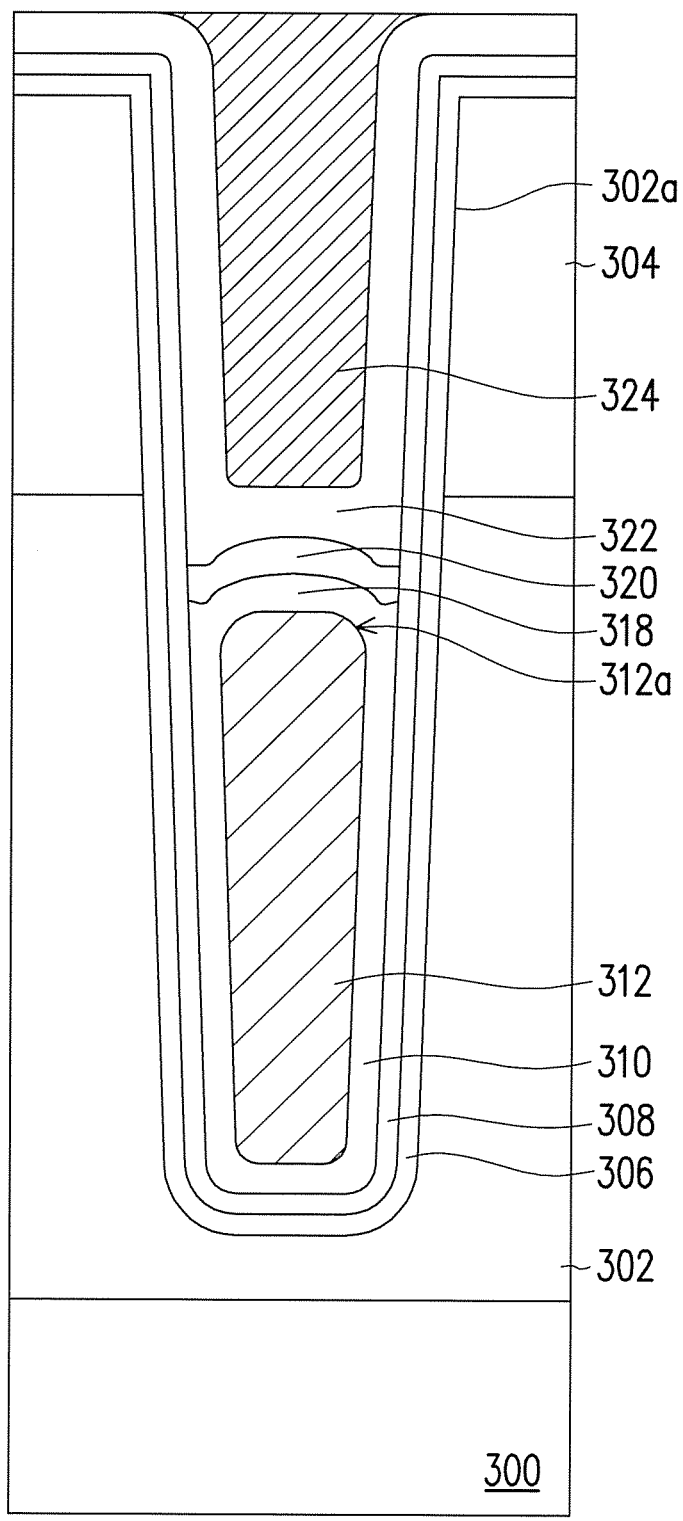

With reference to FIG. 3F, a mask layer 324 is formed on the CVD oxide layer 322 in the first trench 302a. The detailed method of fabricating the mask layer 324 as well as the structure and the material of the mask layer 324 may be referred to as those provided in the first embodiment and thus will not be further explained.

Figure 3G:
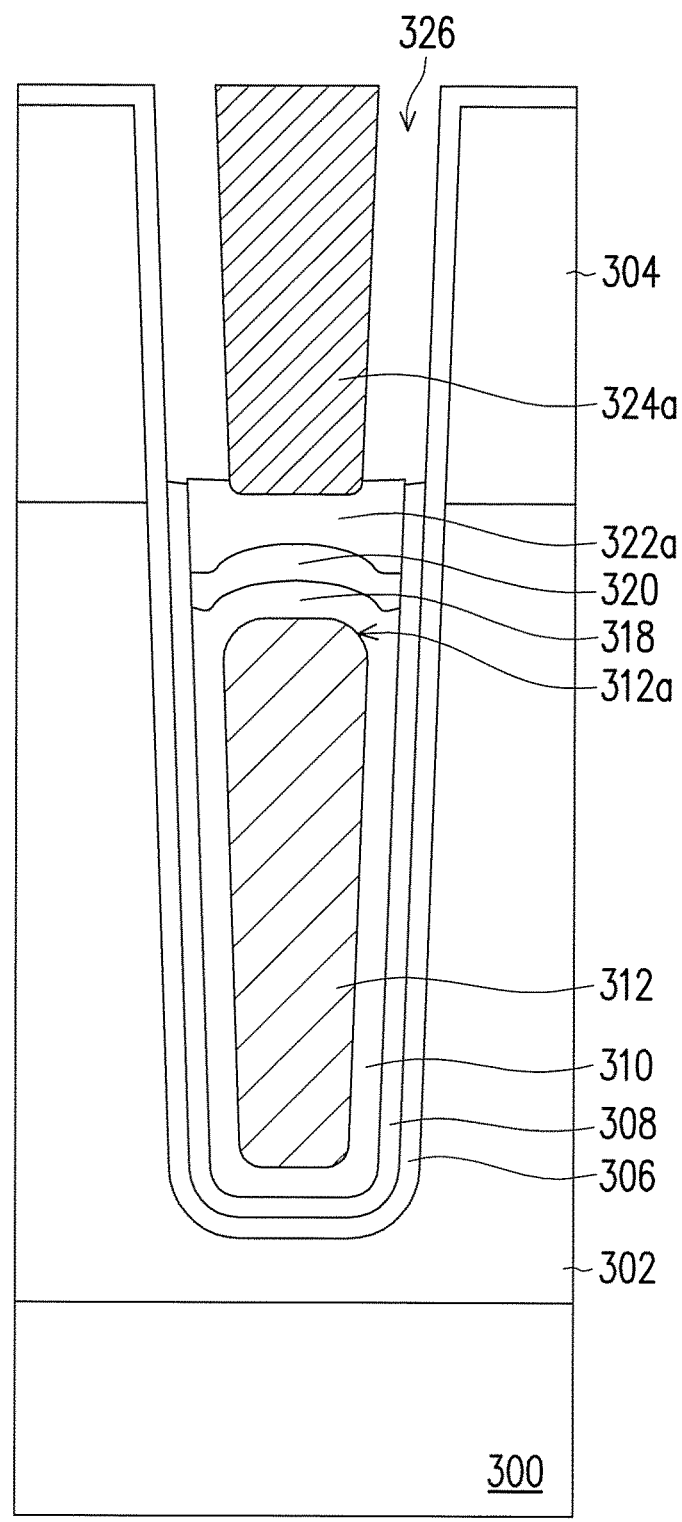

With reference to FIG. 3G, the mask layer 324 shown in FIG. 3F may be etched back (i.e., through performing an anisotropic etching process), and the exposed CVD oxide layer 322 is removed by using the mask layer 324a as the etching mask. The exposed silicon nitride layer 308 is then removed to form the second trench 326. In the present embodiment, the mask layer 324a is able to protect the oxide between the mask layer 324a and the first gate 312, e.g., the second thermal oxide layer 318, the third thermal oxide layer 320, and the CVD oxide layer 322a.

Figure 3H:
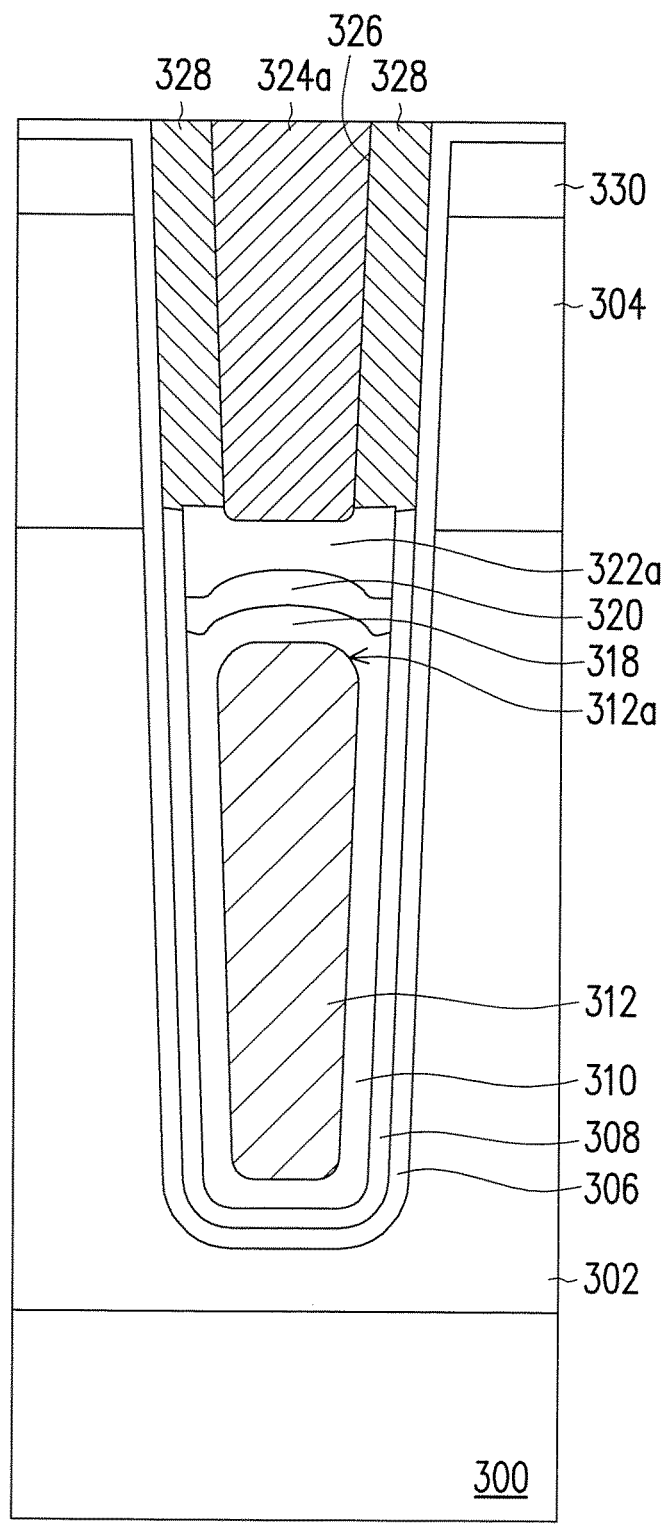

With reference to FIG. 3H, a second gate 328 is formed in the second trench 326. The detailed method of fabricating the second gate 328 may be referred to as that provided in the first embodiment and thus will not be further explained. A source region 330 can then be formed in the well region 304 through performing an implantation process or the like after the second gate 328 is formed. In the present embodiment, the mask layer 324a is made of a conductive material and can function as the second gate of the power MOSFET. Besides, since the mask layer 324a and the second gate 328 are not simultaneously formed, the material of the mask layer 324a may be different from the material of the second gate 328. In addition, the oxide quality of the CVD oxide layer 322a is greater than that of the oxide layer formed by performing the thermal oxidation process; therefore, the CVD oxide layer 322a formed between the first gate 312 and the second gate 328 can effectively isolate the first gate 312 from the second gate 328. As such, the power MOSFET provided in the present embodiment can tolerate high potential without triggering the issue of current leakage. The first thermal oxide layer 306 located in the well region 304 may serve as a gate oxide layer, and a drain region (not shown) is often located on one side of the substrate 300 where no semiconductor layer 302 is formed. Besides, according to the actual design, the height of the second gate 328 may be changed, or film layers (e.g., an insulation layer, not shown) may be disposed on the second gate 328.

FIG. 4A through FIG. 4D are cross-sectional views depicting a variation example in the second embodiment, wherein the same or similar reference numerals are applied to represent the same components in the second embodiment, and no repetitive description will be provided hereinafter.

Figure 4A:
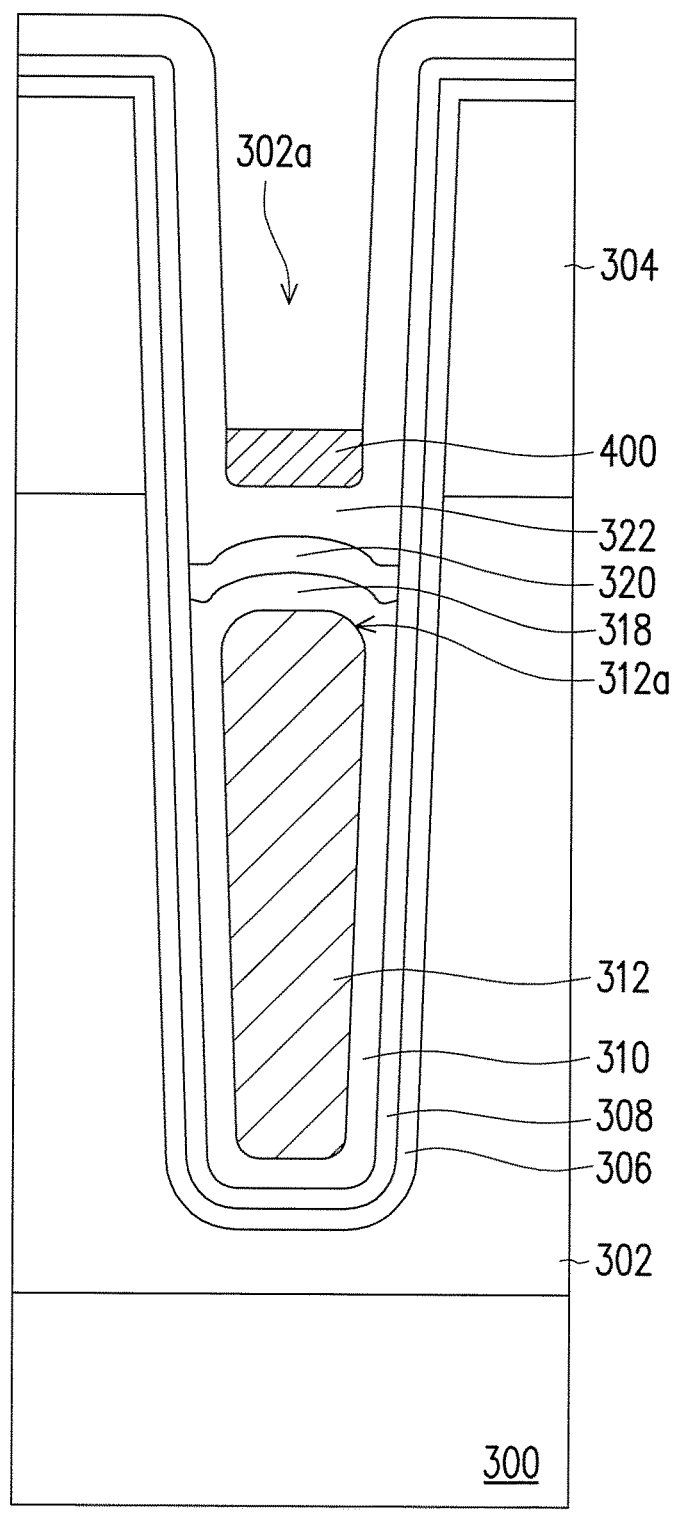
FIG. 4A through FIG. 4D are cross-sectional views depicting a variation example in the second embodiment.

With reference to FIG. 4A, after the fabricating steps depicted in FIG. 3A to FIG. 3F are performed, the mask layer may be etched back (i.e., through performing an anisotropic etching process), so as to obtain the mask layer 400 shown in FIG. 4A. The mask layer 400 can be made of a conductive material (e.g., metal, polysilicon, or amorphous silicon that can be used as the gate) or a non-conductive material having the etching rate lower than that of oxide, e.g., silicon nitride.

Figure 4B:
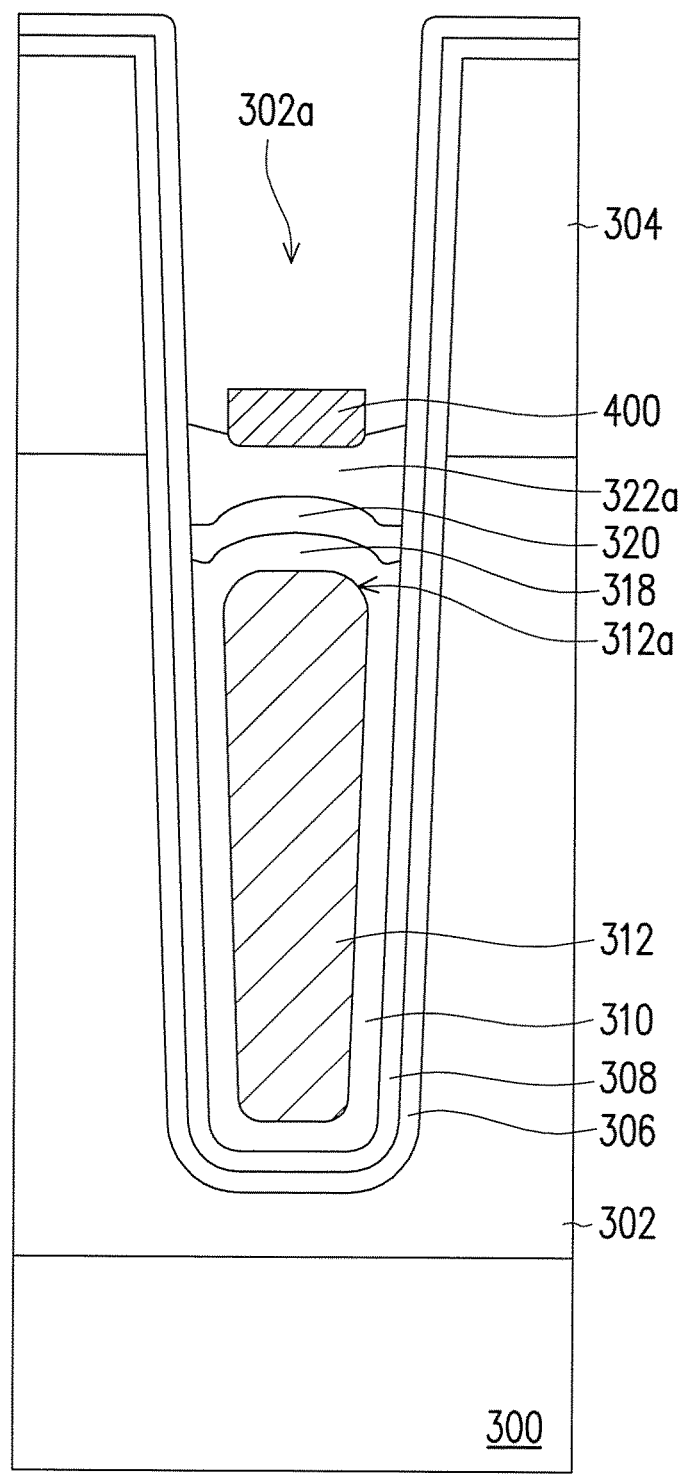

As shown in FIG. 4B, the exposed CVD oxide layer (e.g., the layer 322 shown in FIG. 4A) with use of the mask layer 400 as an etching mask is removed, so as to expose a portion of the silicon nitride layer 308. At this time, the mask layer 400 serves as the protection layer of the CVD oxide layer 322a in the etching process.

Figure 4C:
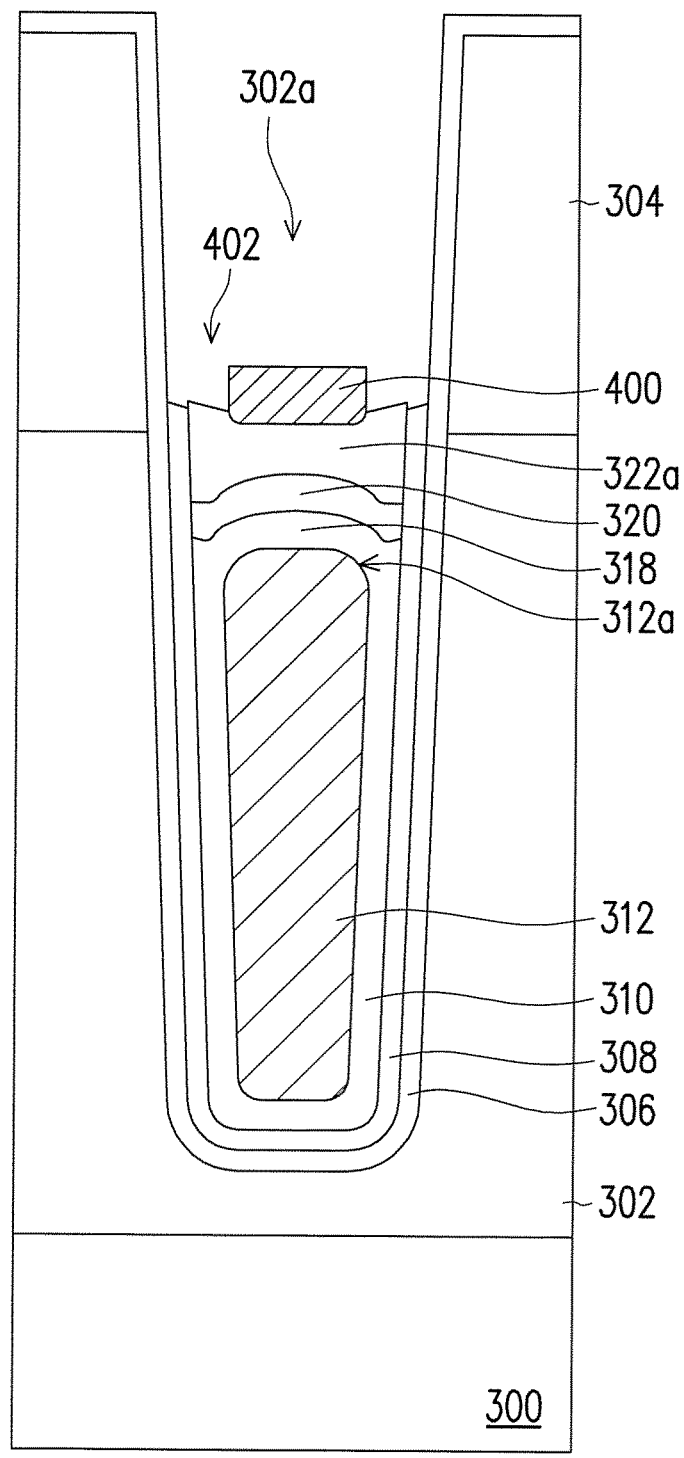

As shown in FIG. 4C, the exposed silicon nitride layer 308 is then removed to form the second trench 402.

Figure 4D:
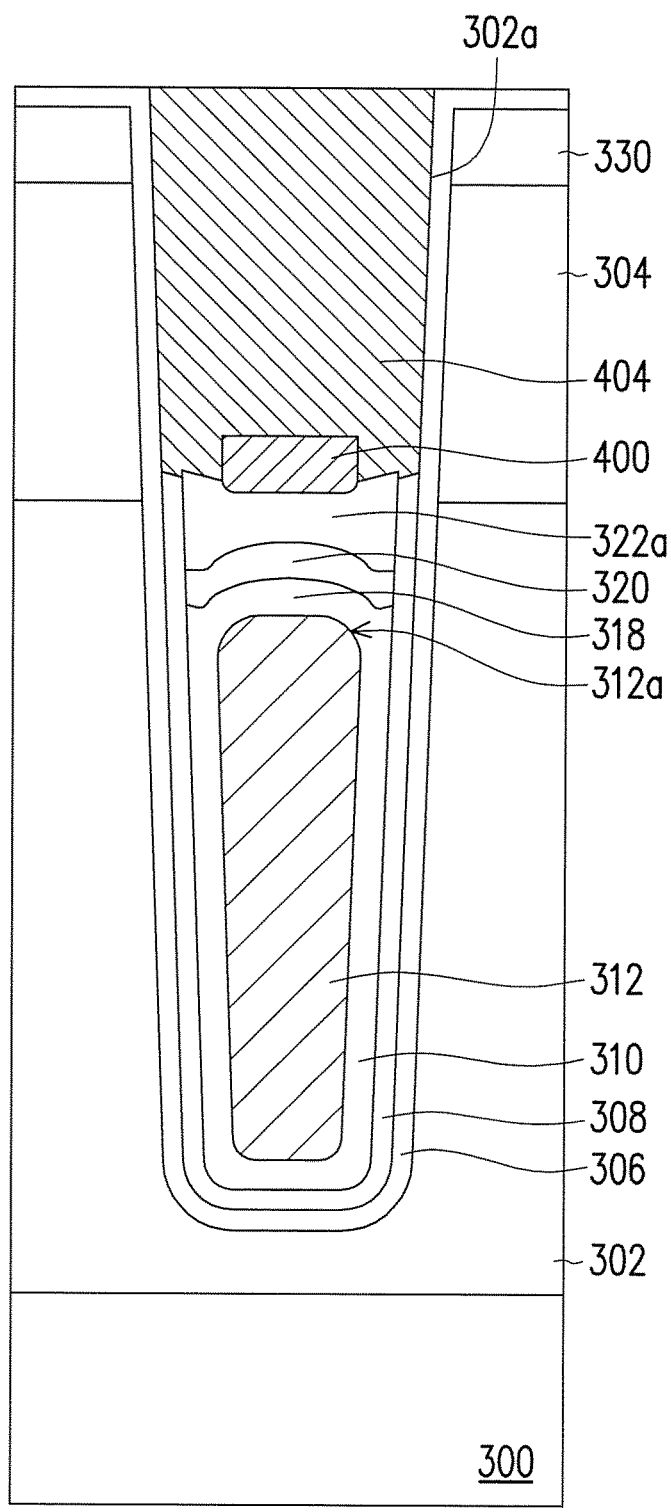

With reference to FIG. 4D, a second gate 404 is formed in the first trench 302a. The second gate 404 is, for instance, formed by forming a conductive layer on the semiconductor layer 302 and in the first trench 302a through performing a CVD process, a PVD process, or any other suitable film-forming process and performing a CMP process or an anisotropic etching process on the conductive layer. A source region 330 can then be formed in the well region 304. In the present embodiment, the mask layer 400 is made of a material having the etching rate lower than that of oxide, for instance. Additionally, the mask layer 400 is covered by the second gate 404, and therefore the mask layer 400 can be made of a non-conductive material without posing a negative impact on the operation of the power MOSFET except for a conductive material (e.g., metal, polysilicon, or amorphous silicon) that can be applied as the gate. The non-conductive material may have the etching rate lower than that of oxide, e.g., silicon nitride without posing a negative impact on the operation of the power MOSFET. In the meantime, the second gate 404 provided in the second embodiment covers the entire mask layer 400 and thus can repair damages caused in the etching process to the mask layer 400.

To sum up, since the CVD oxide layer is formed between the first gate and the second gate according to an embodiment of the invention, the quality of the oxide between the first gate and the second gate can be effectively enhanced; as a result, the power MOSFET provided herein is able to tolerate high operating voltage without triggering the issue of current leakage, and the device reliability can thus be improved. Besides, the mask layer formed in the method of fabricating the power MOSFET provided herein can also be considered as part of the second gate, and thus the variability of the overall fabricating process can be enhanced.

Although the disclosure has been provided with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A method of fabricating a power metal oxide semiconductor field effect transistor, comprising:
   forming a semiconductor layer on a substrate;
   forming at least one first trench in the semiconductor layer;
   forming a first thermal oxide layer on a surface of the first trench;
   forming a first gate in the first trench;
   forming a first chemical vapor deposition oxide layer on the first gate in the first trench;
   forming a mask layer on the first chemical vapor deposition oxide layer in the first trench, wherein a second trench exists between the mask layer and the first thermal oxide layer; and
   forming a second gate in the second trench.

2. The method according to claim 1, further comprising removing a portion of the first thermal oxide layer on a sidewall of the first trench after forming the first gate in the first trench, so as to thin out the first thermal oxide layer.

3. The method according to claim 1, further comprising forming a second thermal oxide layer on the first gate before forming the first chemical vapor deposition oxide layer on the first gate in the first trench.

4. The method according to claim 3, wherein the step of forming the second thermal oxide layer comprises:
   performing an implantation process on the first gate;
   removing a portion of the first thermal oxide layer to expose corners of the first gate and thin out the first thermal oxide layer; and
   performing a thermal oxidation process to form the second thermal oxide layer and round the corners of the first gate.

5. The method according to claim 1, wherein a method of forming the first chemical vapor deposition oxide layer on the first gate in the first trench comprises:
   forming the first chemical vapor deposition oxide layer on the semiconductor layer and in the first trench through performing a chemical vapor deposition process;
   forming the mask layer in the first trench, so as to expose a portion of the first chemical vapor deposition oxide layer; and
   removing the exposed portion of the first chemical vapor deposition oxide layer by using the mask layer as an etching mask, so as to form the second trench.

6. The method according to claim 5, further comprising:
   forming a silicon nitride layer on the first thermal oxide layer before forming the first chemical vapor deposition oxide layer; and
   removing an exposed portion of the silicon nitride layer after removing the exposed portion of the first chemical vapor deposition oxide layer.

7. The method according to claim 1, wherein the second gate further covers the mask layer.

8. The method according to claim 7, wherein the mask layer comprises a conductive material or a non-conductive material.

9. The method according to claim 1, wherein the mask layer comprises a conductive material.

10. The method according to claim 1, wherein a method of forming the first chemical vapor deposition oxide layer comprises performing a high temperature chemical vapor deposition process or a chemical vapor deposition process with use of tetraethyl orthosilicate as a raw material.

11. The method according to claim 1, after forming the first thermal oxide layer on the surface of the first trench, the method further comprising:
- forming a silicon nitride layer on the first thermal oxide layer; and
- forming a second chemical vapor deposition oxide layer on the silicon nitride layer.

12. The method according to claim 11, further comprising removing a portion of the second chemical vapor deposition oxide layer on a sidewall of the first trench after forming the first gate in the first trench, so as to thin out the second chemical vapor deposition oxide layer.

13. The method according to claim 11, further comprising forming a second thermal oxide layer on the first gate before forming the first chemical vapor deposition oxide layer on the first gate in the first trench.

14. The method according to claim 13, wherein the step of forming the second thermal oxide layer comprises:
- performing an implantation process on the first gate;
- removing a portion of the second chemical vapor deposition oxide layer to expose corners of the first gate and thin out the second chemical vapor deposition oxide layer; and
- performing a thermal oxidation process to form the second thermal oxide layer and round the corners of the first gate.

15. The method according to claim 14, further comprising forming a third thermal oxide layer on the second thermal oxide layer before forming the first chemical vapor deposition oxide layer on the first gate and after forming the second thermal oxide layer on the first gate.

16. The method according to claim 11, wherein a method of forming the first chemical vapor deposition oxide layer on the first gate in the first trench comprises:
- forming the first chemical vapor deposition oxide layer on the semiconductor layer and in the first trench through performing a chemical vapor deposition process;
- forming the mask layer in the first trench, so as to expose a portion of the first chemical vapor deposition oxide layer;
- removing the exposed portion of the first chemical vapor deposition oxide layer by using the mask layer as an etching mask, so as to expose a portion of the silicon nitride layer; and
- removing the exposed portion of the silicon nitride layer to form the second trench.

17. The method according to claim 16, wherein the second gate further covers the mask layer.

18. The method according to claim 17, wherein the mask layer comprises a conductive material or a non-conductive material.

19. The method according to claim 11, wherein a method forming the second chemical vapor deposition oxide layer comprises performing a high temperature chemical vapor deposition process or a chemical vapor deposition with use of tetraethyl orthosilicate as a raw material.

* * * * *